United States Patent [19]

Haskell

[11] Patent Number: 4,686,559
[45] Date of Patent: Aug. 11, 1987

[54] TOPSIDE SEALING OF INTEGRATED CIRCUIT DEVICE

[75] Inventor: Jacob D. Haskell, Palo Alto, Calif.

[73] Assignee: Advanced Micro Devices, Inc., Sunnyvale, Calif.

[21] Appl. No.: 637,458

[22] Filed: Aug. 3, 1984

[51] Int. Cl.⁴ .................................... H01L 21/318
[52] U.S. Cl. .................... 357/54; 427/126.4; 437/236; 437/241
[58] Field of Search .............. 427/88, 94, 89, 90, 427/126.4; 357/54

[56] References Cited

U.S. PATENT DOCUMENTS

| 4,194,934 | 3/1980 | Blaske | 357/54 |
| 4,283,439 | 8/1981 | Higashinakagawa et al. | 427/89 |
| 4,396,934 | 8/1983 | Nishida | 357/52 |
| 4,516,313 | 5/1985 | Tyri | 357/54 |

FOREIGN PATENT DOCUMENTS 22865  2/1980  Japan .................................... 427/94

OTHER PUBLICATIONS

Gardiner et al, "Al₂O₃ Protection of S₃N₄ During, RF Sputtering Etching" IBM TDB, vol. 13, No. 12, May 1971, p. 3657.

Primary Examiner—John D. Smith
Attorney, Agent, or Firm—Patrick T. King; John P. Taylor; Eugene H. Valet

[57] ABSTRACT

An improved topside sealing of integrated circuit devices is disclosed which provided for hermetically sealing the top surface of the device comprising depositing a sealing layer of a nitride compound directly on the surface to be sealed. In a preferred embodiment, a protective layer may then be deposited over the nitride layer without any intervening masking steps being necessary.

8 Claims, 4 Drawing Figures

TOPSIDE SEALING OF INTEGRATED CIRCUIT DEVICE

BACKGROUND OF THE INVENTION

1. Technical Field of the Invention

This invention relates to integrated circuit devices. More particularly, this invention relates to improved topside sealing of integrated circuit devices.

2. Background Art

In the production of integrated circuit devices, the topside metallized layer must be hermetically sealed to prevent attack by moisture or other corrosive environmental effects. Conventionally, an oxide layer is first deposited over the metal layer, masked to open areas, and then a nitride sealing layer, such as silicon nitride, is deposited in a thickness of about 8000 Angstroms followed by a second masking operation to open up areas in the nitride layer.

This double deposition, with intervening masking steps, is costly and can also result in disruption of the integrity of the nitride seal adjacent to the openings if the nitride layer is not sufficiently thick. On the other hand, the thicker the nitride layer, the more brittle the nitride layer becomes which can, in turn, result in cracking which will also disrupt the seal. As shown in FIG. 1, which represents the prior art, if the nitride layer, in the immediate vicinity of the opening in the areas shown within the dotted lines denoted by the numeral 10 in FIG. 1, cracks or in any other way fails, moisture can penetrate along the metal-oxide interface to completely destroy the seal. Furthermore, as previously stated, this type of sealing process results in the need for two independent depositions with two separate maskings to provide the necessary contact openings to the metallized layer being sealed.

The two mask process is needed to obtain the overlap of the nitride layer inside the opening in the oxide layer over the metal pad as shown in FIG. 1. Usually the second mask is an undersized version of the first mask used for etching. The first mask and etch open up the oxide over the metal whilst the second mask and etch open up the nitride over the metal.

It would, therefore, be desirable to provide an improved seal which would, at the same time, eliminate some of the intermediate processing steps.

SUMMARY OF THE INVENTION

It is therefore an object of this invention to provide an improved topside seal for integrated devices.

It is another object of the invention to provide an improved topside seal for integrated devices using a single nitride layer applied directly to the surface to be sealed.

It is yet another object of the invention to provide an improved topside seal for integrated devices using a single nitride layer applied directly to the surface to be sealed wherein a second protective layer may be directly applied over the nitride layer without intervening masking steps.

These and other objects of the invention will be apparent from the drawings and description of the invention which follows.

In accordance with the invention, an improved topside sealing of integrated circuit devices is provided for hermetically sealing the top surface of the device comprising depositing a sealing layer of a nitride compound directly on the surface to be sealed. In preferred embodiment, a protective layer may then be deposited over the nitride layer without any intervening masking steps being necessary.

DESCRIPTION OF THE PREFERRED EMBODIMENT

Figure 3:
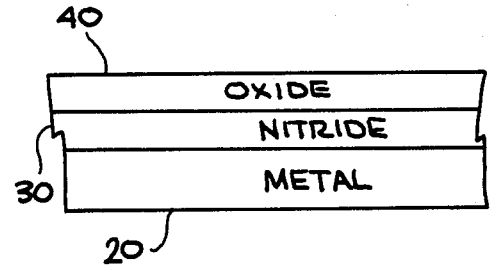
FIG. 3 is a fragmentary cross-sectional view of a second step of forming the hermetic seal of the invention.

In accordance with the invention, the surface of the integrated circuit device to be hermetically sealed has applied to a metallized surface layer 20 thereon a first sealing layer 30 of a nitride, such as silicon nitride. To protect sealing layer 30, a second, protective layer 40 may be applied over nitride layer 30 as shown in FIG. 3 without any intervening masking steps being necessary. After application of protective layer 40, photoresist layer is applied, and the device is then masked, developed, and etched to open up the contact area as shown in FIG. 4.

Figure 1:
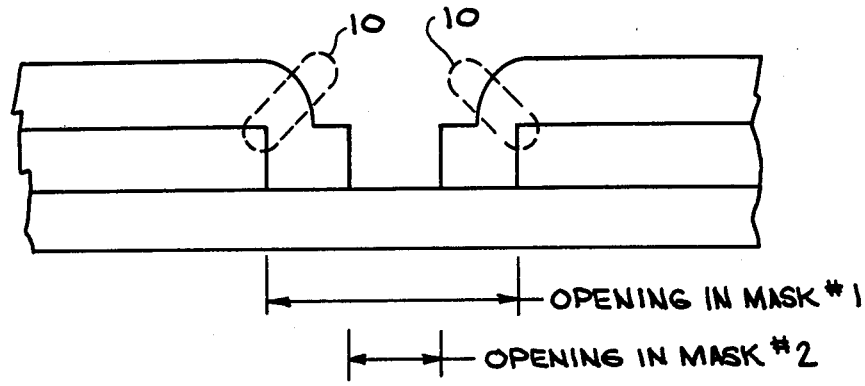
FIG. 1 is a fragmentary cross-sectional view of a prior art construction.
Figure 2:
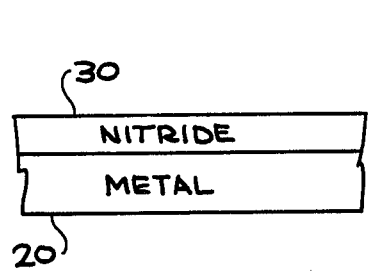
FIG. 2 is a fragmentary cross-sectional view of a first step in forming the hermetic seal of the invention.
Figure 4:
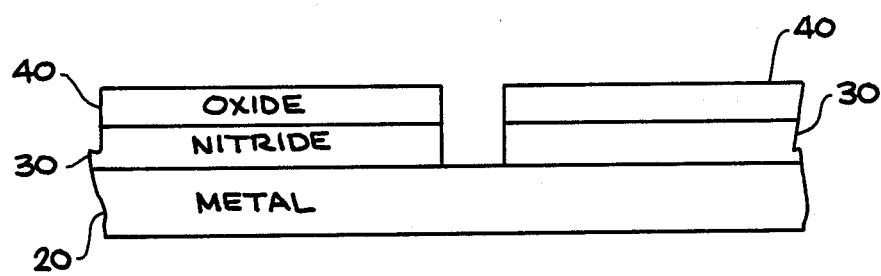
FIG. 4 is a fragmentary cross-sectional view of the third and final step of forming the hermetic seal of the invention.

It will be noted, in particular, that the seal shown in FIG. 4 differs radically from the prior art seal of FIG. 1 in that there is no particular critical area adjacent to the seal opening area as there was in dotted line area 10 shown in the prior art design of FIG. 1. This is because of the direct application of the nitride sealing layer 30 to the metallized layer 20 thereunder in accordance with the invention, and without the thinning of the nitride over the oxide step as in area 10 of FIG. 1.

Thus, if, at any particular point, such as the opening area over metal or adjacent to a surface crack over metal, penetration of moisture to the underlying layer occurs, this penetration cannot travel horizontally across the interface as was true with the oxide-metal interface of the prior art structure since the remainder of the nitride layer provides a seal to the metallized layer which operates not only vertically but horizontally as well.

The result then is not only a markedly improved seal but an elimination of an entire set of intermediate masking, developing and etching steps which were required in the prior art in between the deposition of the oxide layer and the deposition of the nitride layer. Furthermore, since there is not a single, crucial, penetratable area over the metal opening as was true in the design in FIG. 1, the entire nitride seal may be reduced in thickness because the nitride does not have a step and subsequent thinning over the step as in the prior art of FIG. 1. The thinner nitride layer results in a less brittle construction as well as lowering the overall thickness of the seal to that extent.

In accordance with the invention, the silicon nitride sealing layer may be applied by a plasma deposit at about 300° C. Other types of deposition may be used as well as long as the temperature does not exceed about 450° C. to protect the integrity of the underlying layers. Other nitride materials, which can be used for the sealing layer, include silicon oxynitride.

The nitride layer should be applied to a thickness of at least 2000 Angstroms up to about 6000 Angstroms. A 2000 Angstrom thickness is required to provide a sufficient hermetic seal for the underlying metal layer. However, thicknesses in excess of 6000 Angstroms, while providing adequate sealing may result in unnecessary embrittlement as well as providing unnecessary stress to the overall metal composite.

In accordance with the invention, a protective layer may be applied directly over the nitride layer without any intervening masking operations being necessary. This means that the second, protective layer may be deposited in the same apparatus used to deposit the nitride layer. For example, a silicon oxynitride, aluminum oxide, or a silicon oxide layer may be applied directly over the nitride layer. Such a layer may be, again, applied using a plasma deposition at a temperature of about 300° C. or using other suitable means, such as sputtering or the like, so long as the temperature, again, does not exceed about 450° C.

It should be further noted that other materials may be used if desired as a protective layer. The main reason for the protective layer is to prevent damage to the nitride layer during subsequent processing of the integrated circuit device prior to its completion and packaging. This, for example, can include testing where probe damage to the nitride layer could result if adequate protection was not applied thereover.

Thus, the invention provides an improved hermetic seal for an integrated circuit device whereby the entire surface area is directly sealed by a nitride layer thereby eliminating the critical seal penetration areas adjacent to the topside opening over metal which existed in the prior art. Furthermore, a thinner sealing layer may be used due to this elimination of critical areas adjacent to the opening which can destroy the integrity of the entire seal in the prior art.

Finally, the provision of a nitride sealing layer applied directly to the underlying metal layer to be sealed permits the application of a subsequent protective layer thereto without the need for an intervening masking step thus permitting both the sealing layer and the protective layer to be applied in subsequent depositions in the same apparatus thus greatly decreasing the costs of production of the sealed portion of the integrated circuit. While minor modifications will be apparent to those skilled in the art after reading the foregoing description, such minor modifications should be deemed to be within the scope of the invention which is to be limited only by the appended claims.

Having therefore described the invention, what is claimed is:

1. A process for hermetically sealing the topside metallized layer of an integrated circuit device which comprises the steps of depositing and defining a topside metallized layer on the integrated circuit device, depositing from 2000 to 6000 Angstroms of a sealing layer of a nitride compound directly on the surface of said topside metallized layer to form said hermetic seal and without depositing an oxide layer between said step of depositing said topside metallized layer and said step of depositing said nitride sealing layer, and then forming a protective layer over said nitride hermetic seal to protect said nitride sealing layer.

2. The process of claim 1 wherein said protective layer is deposited over said nitride layer without intervening masking steps.

3. The process of claim 2 wherein said protective layer is applied over said nitride layer in the same deposition apparatus.

4. The process of claim 1 wherein said protective layer comprises an oxygen-containing material.

5. The process of claim 4 wherein said oxygen-containing compound is selected from the class consisting of silicon oxynitride, silicon oxide, and aluminum oxide.

6. The process of claim 5 wherein said oxygen-containing compound is a silicon oxide.

7. A process for hermetically sealing an integrated circuit device which comprises the steps of depositing and defining a topside metallized layer on the integrated circuit device as the final interconnect layer; depositing from 2000 to 6000 Angstroms of a sealing layer of a nitride compound to form a hermetic seal, said sealing process being characterized by the elimination of an intermediate step of depositing an oxide layer between said step of depositing said metallized layer and said step of depositing said nitride layer; and then depositing a protective layer selected from the class consisting of silicon oxynitride, silicon oxide, and aluminum oxide over said nitride hermetic seal to protect said nitride sealing layer from damage during subsequent processing.

8. An integrated circuit device having an hermetic seal applied to the topside metallized layer thereof by the deposition of 2000 to 6000 Angstroms of a nitride sealing layer directly to the underlying topside metallization layer to form said hermetic seal without any intervening oxide layer between said topside metallization layer and said nitride sealing layer whereby intermediate masking and etching steps associated with deposition of said oxide layer may be eliminated and a protective layer selected from the class consisting of silicon oxynitride, silicon oxide, and aluminum oxide applied over said nitride sealing layer to protect said nitride sealing layer from damage during subsequent processing.

* * * * *